United States Patent [19]

Nishinoiri et al.

[11] Patent Number: 4,948,699

[45] Date of Patent: Aug. 14, 1990

[54] SILVER HALIDE PHOTOGRAPHIC LIGHT SENSITIVE MATERIAL AND LIGHT SENSITIVE LITHOGRAPHIC PRINTING PLATE MATERIAL

[75] Inventors: Hiroshi Nishinoiri; Toshiro Kondo; Yoshikazu Takaya, all of Nagaokakyo, Japan

[73] Assignee: Mitsubishi Paper Mills Limited, Tokyo, Japan

[21] Appl. No.: 226,388

[22] Filed: Aug. 1, 1988

[30] Foreign Application Priority Data

Aug. 7, 1987 [JP] Japan .................................. 62-197737
Aug. 7, 1987 [JP] Japan .................................. 62-197738

[51] Int. Cl.$^5$ .......................... G03C 5/54; G03C 1/20; G03C 1/28; G03C 5/16
[52] U.S. Cl. .................................... 430/204; 430/229; 430/230; 430/434; 430/264; 430/570; 430/572; 430/573; 430/576; 430/578; 430/584; 430/592; 430/595; 430/627; 430/944
[58] Field of Search ............... 430/204, 229, 230, 944, 430/627, 570, 584, 572, 434, 264, 578, 592, 595, 573, 576, 577

[56] References Cited

U.S. PATENT DOCUMENTS

| | | | |
|---|---|---|---|
| 4,172,732 | 10/1979 | Miyazaka et al. | 430/627 |
| 4,501,811 | 2/1985 | Saikawa et al. | 430/204 |
| 4,686,170 | 8/1987 | Vermeulen et al. | 430/204 |
| 4,770,961 | 9/1988 | Tanaka et al. | 430/204 |
| 4,784,933 | 11/1988 | Kanada et al. | 430/204 |

Primary Examiner—Richard L. Schilling
Attorney, Agent, or Firm—Cushman, Darby & Cushman

[57] ABSTRACT

This invention provides a silver halide photographic light sensitive material and a light sensitive lithographic printing plate material which are enhanced in sensitivity to semiconductor laser beam and improved in storage stability and printing endurance. The former comprises a support and a silver halide emulsion layer containing a sensitizing dye having a spectral sensitivity maximum in a wavelength region longer than 700 nm wherein said emulsion layer contains a water-soluble polymer containing a carboxyl group and having a number-average molecular weight of 20,000 or less and the latter comprises a support and, provided thereon, a silver halide emulsion layer containing a sensitizing dye having a spectral sensitivity maximum in a wavelength region longer than 700 nm and a physical development nuclei layer and said emulsion layer contains the above mentioned water-soluble polymer.

10 Claims, No Drawings

SILVER HALIDE PHOTOGRAPHIC LIGHT SENSITIVE MATERIAL AND LIGHT SENSITIVE LITHOGRAPHIC PRINTING PLATE MATERIAL

BACKGROUND OF THE INVENTION

The present invention relates to a silver halide photographic light sensitive material spectrally sensitized in infrared region and a light sensitive, lithographic printing plate material utilizing silver complex diffusion transfer process.

With recent rapid progress of information transmitting systems, silver halide photographic light sensitive materials have been increasingly required to have high sensitivity. Such systems are, for example, high speed phototypesetting system according to which information output from electronic computer is immediately displayed as letters or figures by cathode ray tube and press facsimile system for rapid transmission of news paper originals to a remote place.

Characteristics required for silver halide photographic light sensitive materials for these uses are high sensitivity to so-called high intensity-short time exposure (flash exposure), namely, exposure for $10^{-4}$ second or less with light sources, e.g., lasers such as cathode ray tube (CRT), helium-neon gas laser and light emission diode (LED), high contrast and high resolving power.

The method of using laser light sources such as helium-neon and argon as a scanning type light source has the defects that large and expensive devices are necessary and efficiency of consumed power is low. On the other hand, semiconductor laser has the advantages that it is small in size, inexpensive, easily modulatable and long in life. For semiconductor laser, there are used semiconductors of such systems as Ga/As/P; Ga/Al/As; Ga/As; In/P; In/As and the like and wavelength of these laser beams is generally longer than 700 nm and largely is longer than 750 nm.

Therefore, bright safelight can be used and thus handleability is good. However, light sensitive materials for infrared rays are generally not so high in sensitivity and inferior in shelf stability and various proposals have been made in an attempt to solve these problems. For example, a technique called supersensitization effect has been proposed according to which spectral sensitivity is markedly enhanced by adding a specifically selected organic compound in addition to spectral sensitizing dye. Reference may be made to, for example, triazine derivatives disclosed in U.S. Pat. Nos. 2,785,058 and 3,695,888, mercapto compounds having electronegative group disclosed in U.S. Pat. No. 3,457,078, benzotriazole derivatives disclosed in Japanese Patent Kokai No. 51-81613, quaternary salts disclosed in Japanese Patent Kokai No. 59-191032 and others disclosed in Japanese Patent Kokai Nos. 61-69063 and 61-27884. However, many of these supersensitization techniques provide unsatisfactory results such as insufficient sensitization, increase of fog and decrease in shelf stability.

As a result of the inventors' intensive research on silver halide photographic light sensitive materials for semiconductor laser beam which are free from the above mentioned problems, it has been found that some compounds are markedly effective for this purpose.

A lithographic printing plate which utilizes as ink receptive areas a transferred silver images produced by the silver complex diffusion transfer process has already been disclosed in Japanese Patent Kokoku No. 48-30562 and Japanese Patent Kokai Nos. 53-21602, 54-103104 and 56-9750.

In a typical embodiment of the silver complex diffusion transfer process suitable for making lithographic printing plates, a silver image is formed in the following way: When a light sensitive material comprising a support and, provided successively thereon, a subbing layer which serves also as antihalation layer, a silver halide emulsion layer and a physical development nuclei layer is imagewise exposed and developed, the silver halide in the latent image area changes into developed silver in the emulsion layer. At the same time, the silver halide in non-latent image area dissolves by the action of a silver halide complexing agent contained in the developer and diffuses to the surface. The dissolved and diffused silver complex is precipitated by the reducing action of the developing agent on the physical development nuclei in the surface layer to form a silver image. After the development, if necessary, the silver image is subjected to sensitization treatment to enhance its ink receptivity. The material thus treated is mounted on an offset printing machine and the inked image is transferred to a print material.

In the conventional process, the silver halide emulsion layer is spectrally sensitized with a merocyanine dye, cyanine dye and the like so as to show a sensitivity maximum at around 550 nm green region. The emulsion layer is exposed in a process camera to a ordinary light source such as a tungsten bulb for several seconds to several tens of seconds. A printing plate obtained in this way, however, exhibited only limited sharpness and resolving power, even though an aforementioned sensitive material inherently excellent in these properties has been used. Moreover, in reproducing a color print from a color original, the conventional process has disadvantages in that both procedures of preparing the sensitive material and making a printing plate are troublesome in addition to the insufficient resolving power.

At present, plate making with laser beam has been proposed as one method for solving the above problems. For example, U.S. Pat. No. 4,501,818 and Japanese Patent Kokai Nos. 59-71055, 60-75838 and 60-100148 disclose lithographic printing plates which are exposed to light sources such as neon-helium laser and light-emitting diodes. As mentioned in these patent and patent publications, in these lithographic printing plates which utilize silver complex diffusion transfer process, the surface physical development nuclei layer affects the spectral sensitization and as a result, there occurs reduction of sensitivity to a laser beam or deterioration in the shelf stability. Further, since the silver complex diffusion transfer process produces a transferred and precipitated silver image of soft gradation, there occur a decrease in both sharpness and resolution of image, staining and worn-off of silver image during printing. These defects result in insufficient printing endurance and detract much from the printing plate quality. Therefore, a desirable sensitizing dye should meet all of the following requirements: sufficiently high sensitivity to the radiation wavelengths from lasers; good shelf stability; formation of transferred and precipitated silver image of high contrast; no adverse effects such as staining; and formation of a transferred and precipitated silver image having a sufficient adherence to keep even small silver grains from worn-off during printing.

There are known various lasers, but the methods of using laser light sources such as helium-neon and argon as a scanning type light sources has the defects and, on the other hand, semiconductor lasers have the advantages as explained hereinabove.

Light sensitive lithographic printing plate materials which utilize such semiconductor laser beams of long wavelength as a light source for imagewise exposure are disclosed in Japanese Patent Application Nos. 60-244880, 60-245059, 60-254202, 60-280426 and 60-284046.

However, it is known that silver halide photographic materials containing a sensitizing dye having a spectral sensitivity maximum in the wavelength region longer than 700 nm are generally inferior in shelf stability. This defect is conspicuous in lithographic printing plate having a physical development nuclei layer contiguous to an emulsion layer and sometimes it is already low in sensitivity or in printing endurance just after production thereof. One reason therefor is that the sensitizing dye undergoes desorption or decomposition with other substances in the silver halide emulsion layer.

According to the inventors' study, it has been found that these defects are improved by increasing the proportion of binder (mainly gelatin) to silver halide in silver halide emulsion layer, but increase the amount of binder inhibits precipitation of transferred silver, resulting in problems in printability. Thus, there is needed a method for solving the problems without giving adverse effect on printability. It is also necessary to gain further higher sensitivity to semiconductor laser beams.

SUMMARY OF THE INVENTION

An object of this invention is to provide a silver halide photographic light sensitive material enhanced in sensitivity in infrared region such as semiconductor laser beams, which is longer than 700 nm, especially longer than 750 nm.

Another object of this invention is to provide a silver halide photographic light sensitive material which has no problems of fog and enhanced in shelf stability.

Still another object of this invention is to provide a lithographic printing plate material utilizing silver complex diffusion transfer process to make a printing plate therefrom which has high sensitivity to semiconductor laser beams of low output and has high printing endurance and superior shelf stability.

DESCRIPTION OF THE INVENTION

The above object of this invention has been attained by a silver halide photographic light sensitive material having a silver halide emulsion layer containing a sensitizing dye having a spectral sensitivity maximum in a wavelength region longer than 700 nm, characterized in that said emulsion layer contains a water-soluble polymer having a carboxyl group and having a number-average molecular weight of 20,000 or less.

This invention will be explained in more detail.

The polymer used in this invention is characterized by a water-soluble polymer containing a carboxyl group (including salt or acid anhydride thereof) and having a low molecular weight, namely, a number-average molecular weight of 20,000 or less.

Such water-soluble polymers can be homopolymers of olefinic unsaturated compounds containing carboxyl group as a monomer unit such as homopolymers of acrylic acid, methacrylic acid, sorbic acid, maleic acid, fumaric acid, itaconic acid and citraconic acid and copolymers of olefinic unsaturated compounds containing carboxyl group as a monomer unit with vinyl monomers copolymerizable therewith.

As the vinyl monomers for obtaining the copolymers used in this invention, mention may be made of, for example, styrene and styrene derivative such as styrenes having alkyl groups such as methyl and ethyl, alkoxy groups such as methoxy and ethoxy or halogens such as chlorine as substituents; ethylenically unsaturated monoolefins such as ethylene, propylene, butylene and isobutylene; halogenated vinyls such as vinyl chloride, vinylidene chloride and vinyl bromide; vinyl esters such as vinyl acetate, vinyl propionate, vinyl benzoate and vinyl butyrate; alkyl esters of acrylic acid and methacrylic acid such as methyl, ethyl, propyl, isobutyl, n-butyl, n-octyl and 2-ethylhexyl esters; acrylic acid or methacrylic acid derivatives such as acrylonitrile, methacrylonitrile and acrylamide; vinyl ethers such as vinylmethyl ether, vinylethyl ether and vinylisobutyl ether; vinylketones such as vinylmethyl ketone, vinylhexyl ketone and methylisopropyl ketone; N-vinyl compounds such as N-vinylpyrrole, N-vinylcarbazole and N-vinylpyrrolidone and vinylnaphthalenes. The copolymers may have different olefinic unsaturated compounds containing carboxyl group as copolymer components.

Content of the olefinic unsaturated compound containing carboxyl group in the copolymer is about 10% by weight or more, preferably about 20% by weight or more. This carboxyl group may be a salt of sodium, potassium, ammonium or the like or may be an acid anhydride (such as maleic anhydride).

The water-soluble polymers used in this invention have a number-average molecular weight ($\overline{Mn}$) of 20,000 or less, especially preferably about 1,000—about 10,000.

The water-soluble polymers used in this invention may be easily prepared by known processes such as solution polymerization or may be commercially available.

Examples of the water-soluble polymers are shown below. The polymerization rate is indicated by % by weight.

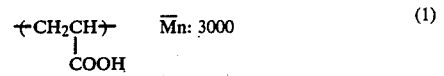

(1)

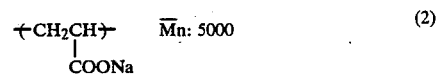

(2)

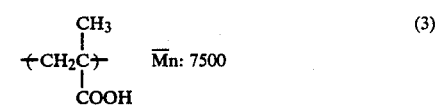

(3)

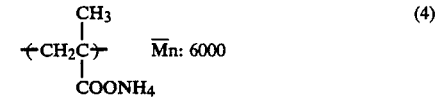

(4)

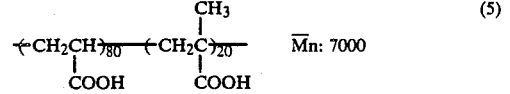

(5)

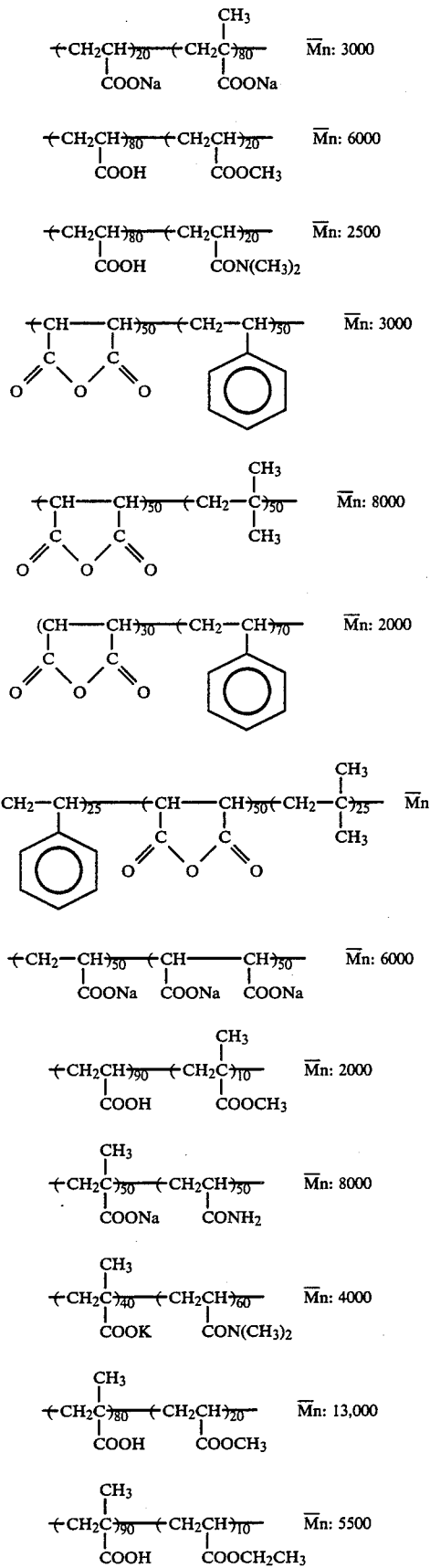
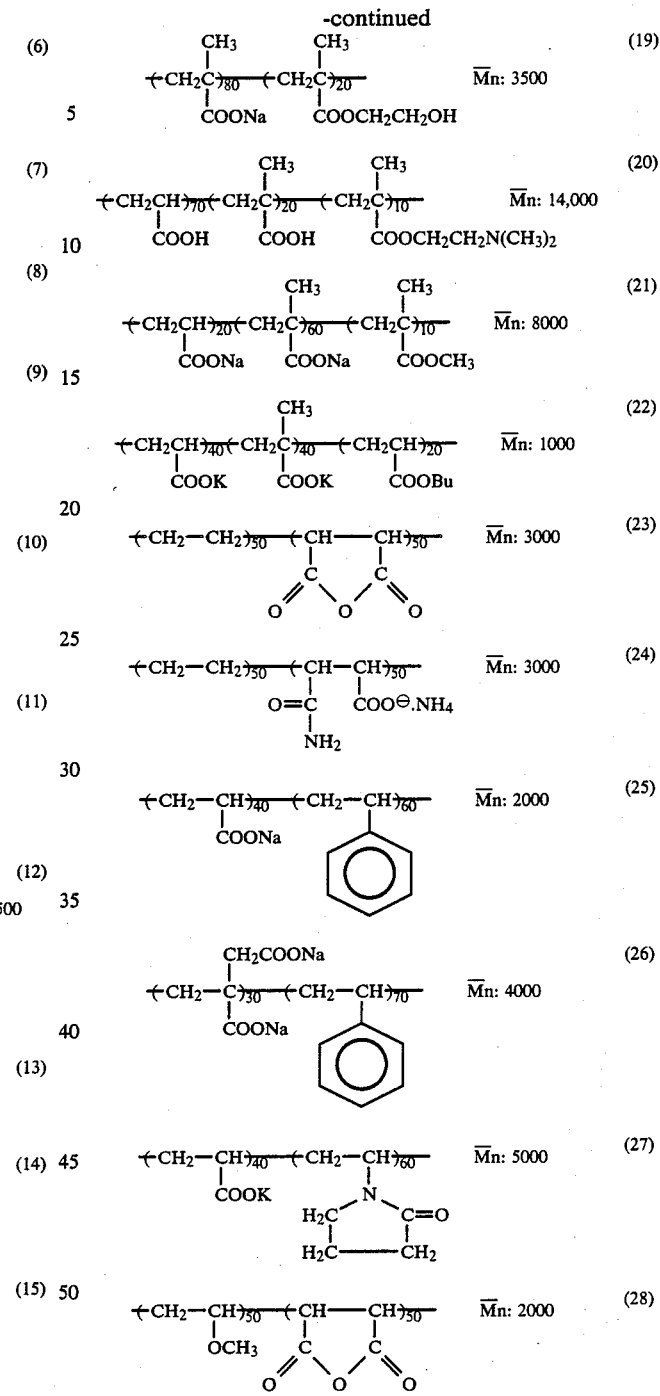

The water-soluble polymer used in this invention is added suitably in an amount of about 1—about 150 g, preferably about 2—about 100 g for 1 mol of silver halide. This may be added at any time before coating of silver halide emulsion.

The sensitizing dyes used in this invention which have maximum spectral sensitivity in a wavelength region longer than 700 nm may be those disclosed, for example, in U.S. Pat. Nos. 2,095,854, 2,095,856, 2,955,939, 3,482,978, 3,552,974, 3,573,921, 3,582,344 and 3,623,881.

Preferably, those represented by the following formulas (I)–(IV) are used.

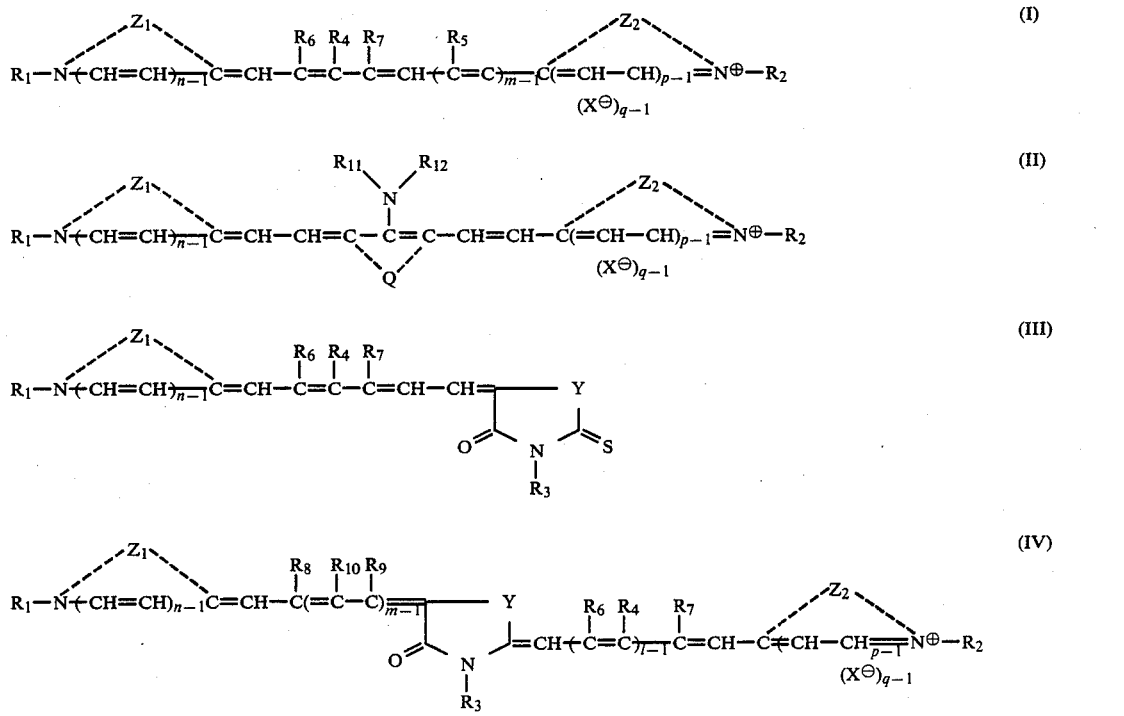

In the above formulas (I)–(IV), $Z_1$ and $Z_2$ which may be identical or different each represents group of atoms necessary to form 5-membered or 6-membered nitrogen-containing heterocyclic ring; $R_1$ and $R_2$ which may be identical or different each represents an alkyl group or an alkenyl group; $R_3$ represents an alkyl group, an alkenyl group or an aryl group; $R_4$–$R_{10}$ which may be identical or different each represents a hydrogen atom, a halogen atom, an alkyl group, an aryl group or an alkoxy group and $R_6$ and $R_7$ or $R_8$ and $R_9$ may link to each other to form a 5-membered or 6-membered ring; $R_{11}$ and $R_{12}$ which may be identical or different each represents an alkyl group or an aryl group and may link to each other to form a 5-membered or 6-membered ring; Y represents a sulfur atom, an oxygen atom, $>N-R_{13}$ ($R_{13}$ is an alkyl group), X represents an acid anion; l, m, n, p and q each represents 1 or 2 and Q represents a group of atoms necessary to form 5-membered or 6-membered ring.

As examples of $Z_1$ and $Z_2$, mention may be made of nitrogen-containing heterocyclic rings such as thiazole, benzothiazole, naphtho[1,2-d]thiazole, naphtho[2,1-d]thiazole, naphtho[2,3-d]thiazole, selenazole, benzoselenazole, naphtho[2,1-d]selenazole, naphtho[1,2-d]selenazole, oxazole, benzoxazole, naphtho[1,2-d]oxazole, naphtho[2,1-d]oxazole, naphtho[2,3-d]oxazole, 2-quinoline, 4-quinolene, 3,3-dialkylindolenine, imidazole, benzimidazole, naphtho[1,2-d]imidazole and pyridine. These heterocyclic rings may have at least one substituent such as, for example, alkyl group (e.g., methyl, ethyl, butyl and trifluoromethyl), aryl group (e.g., phenyl and tolyl), hydroxy group, alkoxy group (e.g., methoxy, ethoxy and butoxy), carboxyl group, alkoxycarbonyl group (e.g., methoxycarbonyl and ethoxycarbonyl), halogen atom (e.g., fluorine, chlorine, bromine and iodine), aralkyl group (e.g., benzyl and phenethyl), cyano group and alkenyl group (e.g., allyl).

As alkyl groups for $R_1$ and $R_2$, mention may be made of, for example, lower alkyl groups such as methyl, ethyl, propyl and butyl, hydroxyalkyl groups such as β-hydroxyethyl and γ-hydroxypropyl, alkoxyalkyl groups such as β-methoxyethyl and γ-methoxypropyl, acyloxyalkyl groups such as β-acetoxyethyl, γ-acetoxypropyl and β-benzoyloxyethyl, carboxyalkyl groups such as carboxymethyl and β-carboxyethyl, alkoxycarbonylalkyl groups such as methoxycarbonylmethyl, ethoxycarbonylmethyl and β-ethoxycarbonylethyl, sulfoalkyl groups such as β-sulfoethyl, γ-sulfopropyl and δ-sulfobutyl and aralkyl groups such as benzyl, phenethyl and sulfobenzyl. Alkenyl groups for $R_1$ and $R_2$ include, for example, allyl group.

As $R_3$, there are alkyl and alkenyl groups as exemplified for $R_1$ and $R_2$ and aryl groups such as, for example, phenyl, tolyl, methoxyphenyl, chlorophenyl and naphthyl.

$R_4$–$R_{10}$ each represents a hydrogen atom, a halogen atom (e.g., chlorine, bromine, iodine and fluorine), an alkyl or aryl group as exemplified for $R_1$ and $R_2$ or an alkoxy group having an alkyl group as exemplified for $R_1$ and $R_2$ (namely, $OR_1$) and 5-membered or 6-membered ring formed by $R_6$ and $R_7$ or $R_8$ and $R_9$ may have substituent such as lower alkyl group. $R_{11}$ and $R_{12}$ each represents an alkyl group or an aryl group as exemplified for $R_1$ and $R_2$ and $R_{11}$ and $R_{12}$ may link to each other to form a 5-membered or 6-membered ring. $R_{13}$ represents an alkyl group as exemplified for $R_1$ and $R_2$.

The acid anions of X include, for example, alkylsulfate ions such as methylsulfate ion and ethylsulfate ion, thiocyanate ion, toluenesulfonate ion, halogen ions such as chloride, bromide and iodide and perchlorate ion. The acid anion is not present when the dye has a betaine analogous structure.

Examples of the sensitizing dyes use in the present invention are enumerated below.

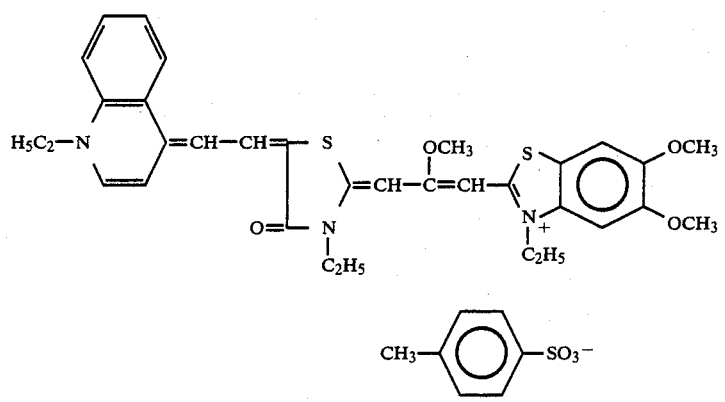
(1)
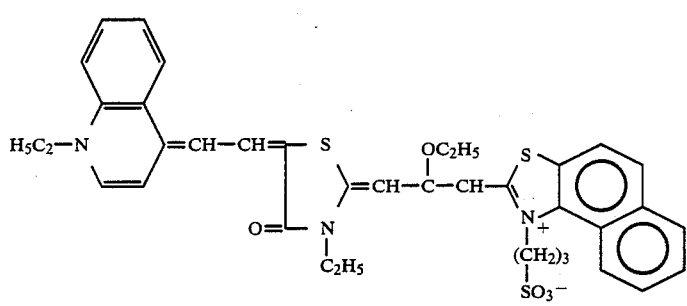
(2)
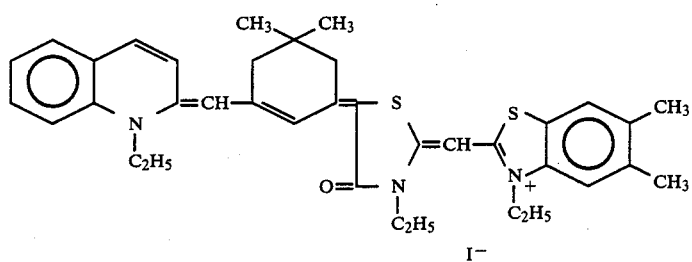
(3)
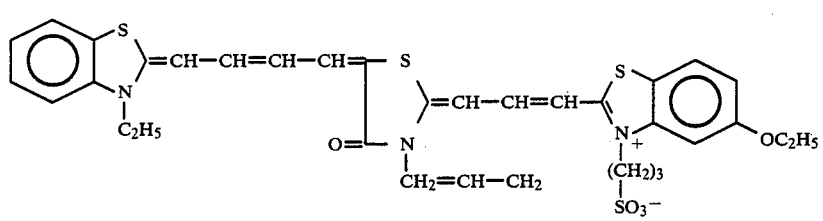
(4)
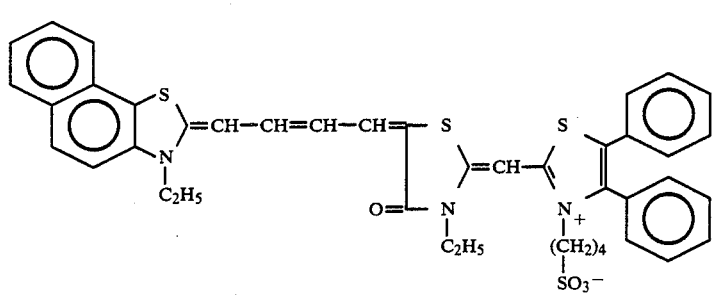
(5)

-continued
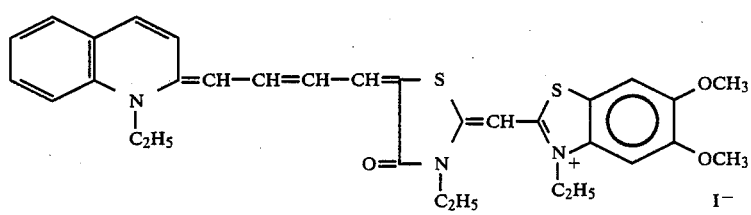
(6)
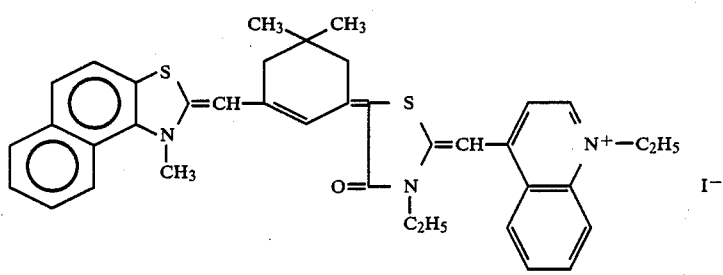
(7)
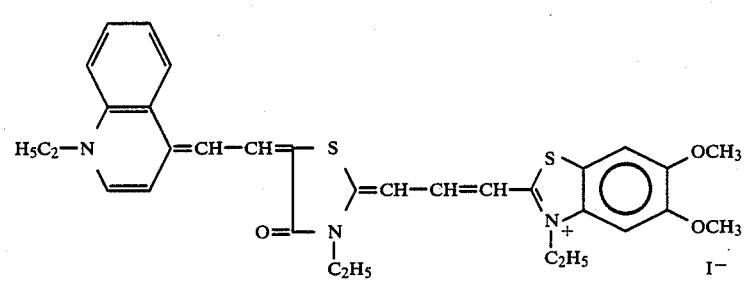
(8)
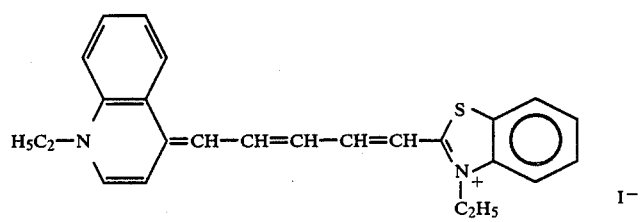
(9)
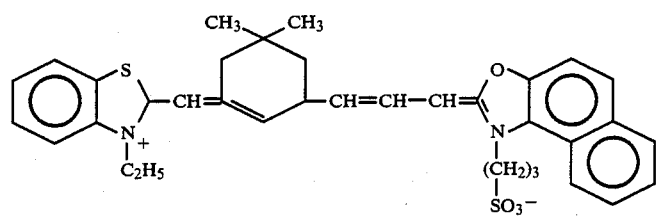
(10)
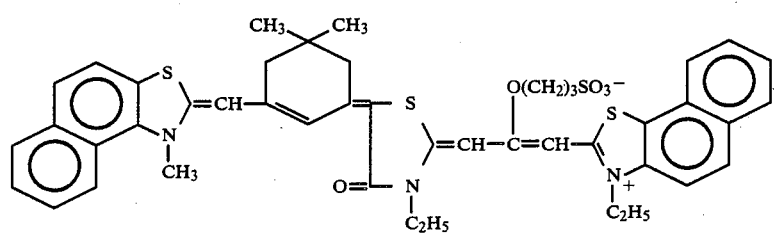
(11)

-continued
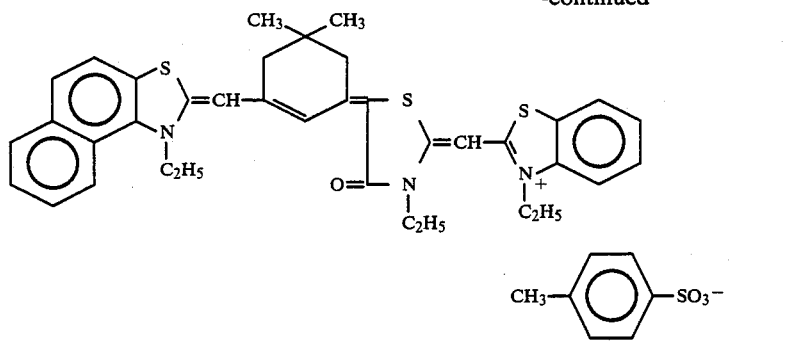 (12)
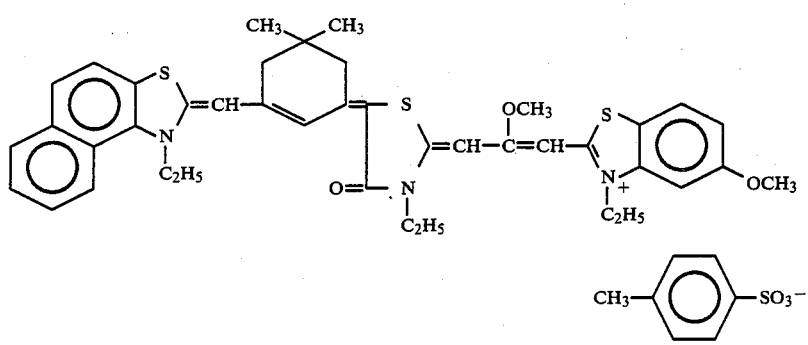 (13)
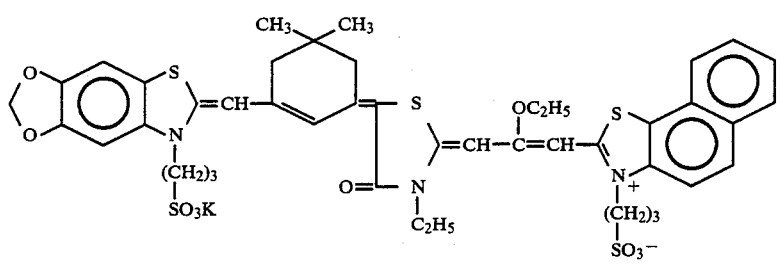 (14)
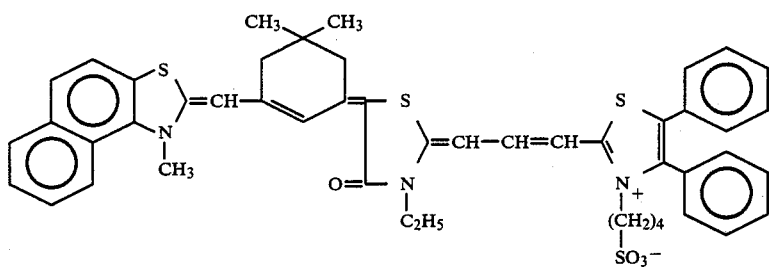 (15)
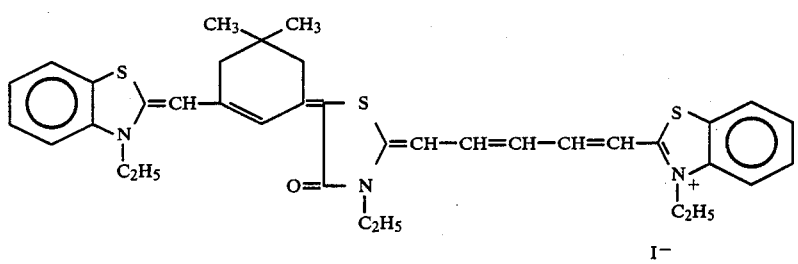 (16)
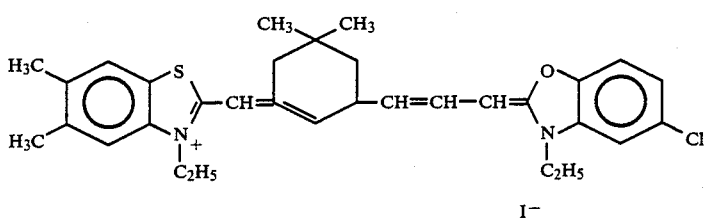 (17)

-continued
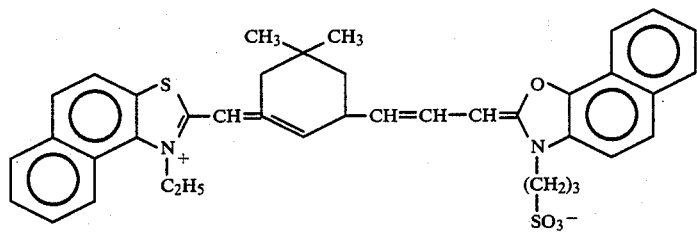
(18)
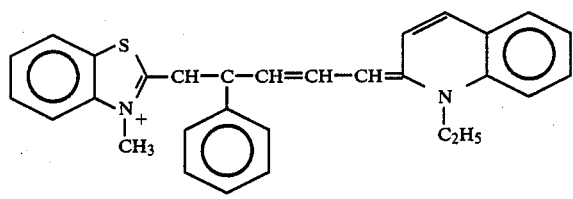
(19)
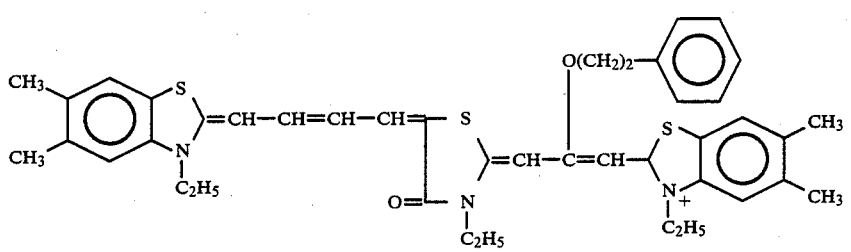
(20)
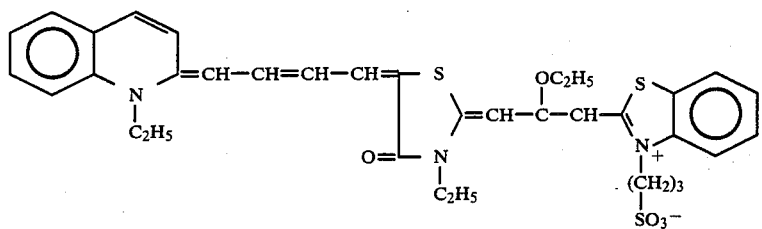
(21)
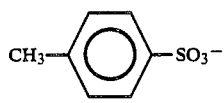
(22)

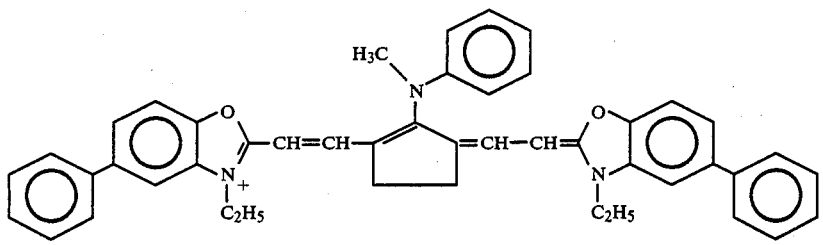
(23)
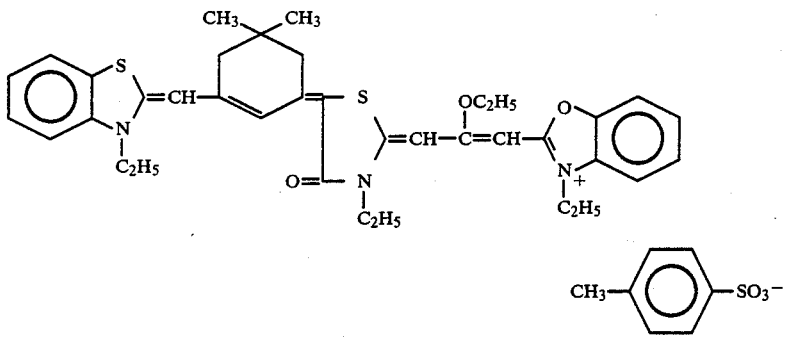
(24)
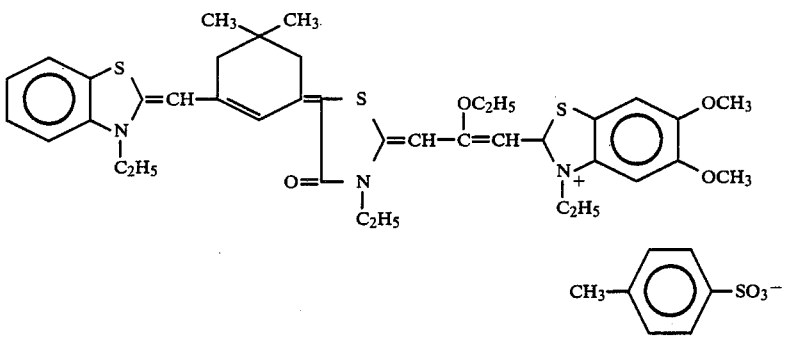
(25)
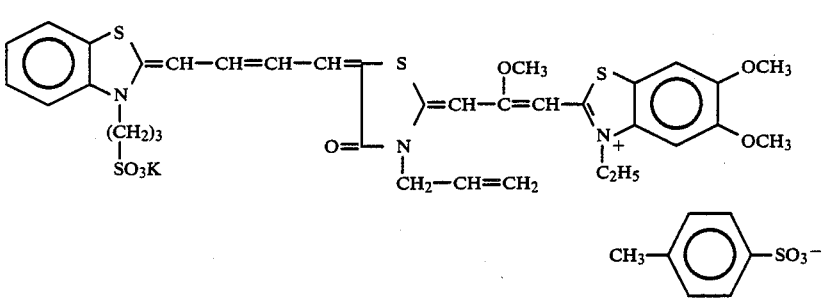
(26)
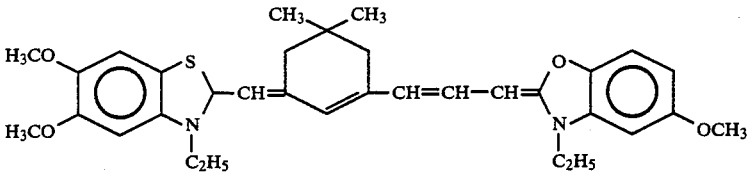
(27)
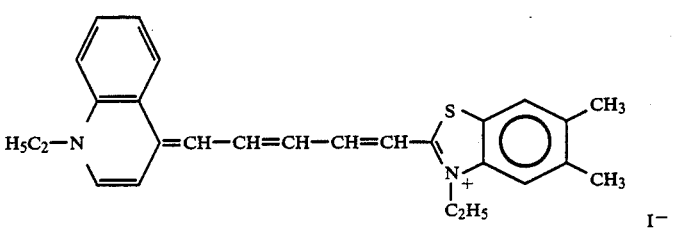
(28)

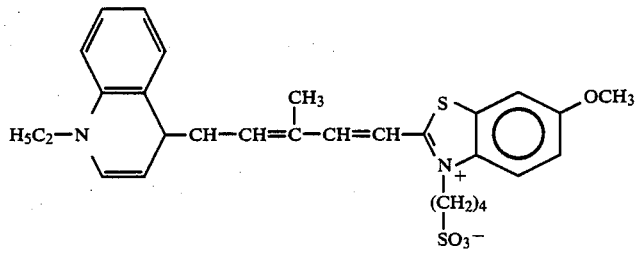

(29)

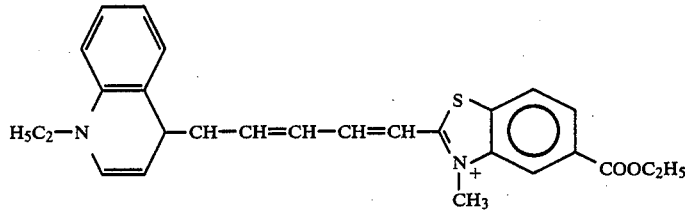

(30)

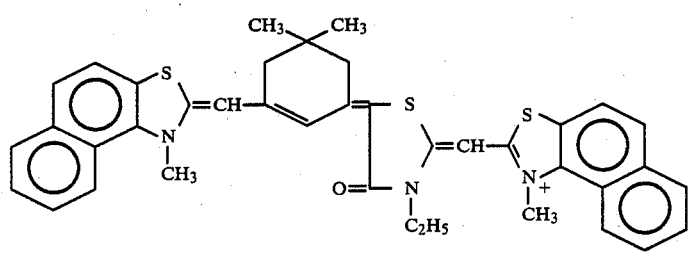

(31)

Addition amount of the sensitizing dye is $1\times10^{-6}-1\times10^{-3}$ mol, preferably $5\times10^{-6}-5\times10^{-4}$ mol per 1 mol of silver halide.

The sensitizing dye may be directly dispersed in emulsion or may be dissolved in a water-miscible solvent such as methanol, ethanol, pyridine, methyl cellosolve, acetone or dimethylformamide (or a mixed solvent thereof) or diluted with water or dissolved in water and added to emulsion in the form of such solution. Ultrasonic vibration can be applied to this dye solution or the solution may be added by the methods disclosed in U.S. Pat. No. 3,469,987 and Japanese Patent Kokoku No. 46-24185: Further, there may be used such methods as disclosed in U.S. Pat. Nos. 2,912,345, 3,342,605, 2,996,287 and 3,425,835.

The silver halide emulsion used in the present invention may be prepared by various known methods.

The silver halide emulsion used in the present invention may be prepared by any precipitation methods, so-called single jet method or controlled double jet method. Preferred is monodispersed emulsion prepared by the latter method. Crystal habits of the silver halide grains may be any of cubic, octahedral, tetradecahedral or tablet form.

Halogen composition of silver halide used in the present invention may be, for example, any of silver chloride, silver bromide, silver chlorobromide or mixtures thereof with silver iodide.

Those characteristics such as high sensitivity, high sharpness and high resolving power may be imparted by adding at any time during the emulsion preparation including precipitation and physical ripening compounds of metals of Group VIII of the periodic table, such as, for example, salts of cobalt, nickel, rhodium, palladium, iridium and platinum. The amount to be added is in the range of $10^{-8}$ to $10^{-3}$ mol for 1 mol of silver halide. The silver halide emulsion layer may further contain other additives such as, for example, coating aids, antifoggants, matting agents (water-holding agents), and developing agents which are normally used.

These emulsions can be chemically sensitized by known methods. That is, sulfur sensitization can be carried out with sulfur compounds disclosed in U.S. Pat. Nos. 1,574,944, 2,278,947, 2,410,689, 3,189,458 and 3,501,313 or sensitizing-type gelatins containing the sulfur compounds. Further, gold sensitization may also be effected with gold compounds disclosed in U.S. Pat. Nos. 2,597,856, 2,597,915 and 2,399,083. Moreover, there may also be effected reduction sensitization as disclosed in U.S. Pat. Nos. 2,518,698, 2,521,925, 2,487,850 and 2,694,637. These sensitizations may also be carried out in combination.

The photographic emulsions used in the present invention can also be sensitized with quaternary ammonium salts, thioether compounds, polyethylene oxide derivatives and diketones. These methods are disclosed in U.S. Pat. Nos. 2,708,162, 3,046,132, 3,046,133, 3,046,134 and 3,046,135 and British Patent No. 939,357.

Various hydrophilic colloids are used in the photographic light sensitive materials of the present invention. As hydrophilic colloids used as vehicles for photographic emulsions and/or other photographic layers, mention may be made of, for example, gelatin, colloidal albumin, casein, cellulose derivatives such as carboxymethyl cellulose and hydroxyethyl cellulose, sugar derivatives such as agar, sodium alginate and starch derivatives, synthetic hydrophilic colloids such as polyvinyl alcohol, poly N-vinylpyrrolidone, polyacrylic acid copolymer, polyacrylamide or derivatives or partial hydrolyzates thereof. If necessary, compatible mixtures of two or more of these colloids may also be used. Among them, gelatin is most commonly used. A part or the whole of the gelatin may be replaced with synthetic high molecular substance. Moreover, the gelatin may be replaced with so-called gelatin derivatives, namely, those in which amino group, imino group, hydroxy group or carboxy group as functional group contained in molecule is treated and modified with a chemical having one group reactive with the above groups or graft polymers to which molecular chain of other high molecular substance is bonded.

The photographic light sensitive material of the present invention may contain inorganic or organic hardeners in photographic emulsion layer or other hydrophilic colloid layers. For example, the following are used alone or in combination: chromium salts (e.g., chrome alum and chromium acetate), aldehydes (e.g., formaldehyde, glyoxal and glutaraldehyde), N-methylol compounds (e.g., dimethylolurea and methyloldimethylhydantoin), dioxane derivatives (e.g., 2,3-dihydroxy dioxane), active vinyl compounds (e.g., 1,3,5-triacryloylhexahydro-S-triazine and 1,3-vinylsulfonyl-2-propanol), active halogen compounds (e.g., 2,4-dichloro-6-hydroxy-S-triazine) and mucohalogenic acids (e.g., mucochloric acid and mucophenoxychloric acid).

Further, photographic emulsion layer or other hydrophilic colloid layers of the light sensitive material of the present invention may contain various surface active agents for various purposes such as coating aid, antistatic agent, improvement of slipping property, emulsification dispersion and anti-tacking agent.

Examples of the surface active agents are non-ionic surface active agents such as saponin (steroid type), alkylene oxide derivatives (for example, polyethylene glycol, polyethylene glycol/polypropylene glycol condensate, polyethylene glycol alkyl ethers, polyethylene glycol alkylaryl ethers, polyethylene glycol esters, polyethylene glycol sorbitan esters, polyalkylene glycol alkylamines or amides and polyethylene oxide adducts of silicon), glycidol derivatives (for example, alkenylsuccinic acid polyglycerides and alkylisoenol polyglycerides), fatty acid esters of polyhydric alcohols and alkyl esters of sugars; anionic surface active agents having acidic group such as carboxyl group, sulfo group, phospho group, sulfuric acid ester group or phosphoric acid ester group such as alkylcarboxylic acid salts, alkylsulfonic acid esters, alkylbenzenesulfonic acid salts, alkylnaphthalenesulfonic acid salts, alkylsulfuric acid esters, alkylphosphoric acid esters, N-acyl-N-alkyltaurines, sulfosuccinic acid esters, sulfoalkylpolyoxyethylenealkylphenyl ethers and polyoxyethylenealkylphosphoric acid esters; cationic surface active agents such as amphoteric surface active agents such as amino acids, aminoalkylsulfonic acids, aminoalkylsulfuric acid or phosphoric acid esters, alkylbetaines and amine oxides; alkylamine salts, aliphatic or aromatic quaternary ammonium salts, heterocyclic quaternary ammonium salts and aliphatic or heterocyclic ring-containing phosphonium or sulfonium salts. Further, properties of gelatin films can be modified by adding latex polymers or surface of the films can be matted by adding silica, starch powder, colloidal silica or glass powder.

Photographic emulsion layer and other hydrophilic colloid layers of the light sensitive material of the present invention may contain various compounds in addition to the water-soluble polymer in order to prevent fogging which may occur during preparation of the light sensitive material, storage of the material or during photographic processing or stabilize photographic properties. That is, there may be used various compounds known as antifoggants or stabilizers, for example, azoles such as benzothiazolium salts, nitroindazoles, triazoles, benzotriazoles and benzimidazoles (especially nitro- or halogen substitutes); heterocyclic mercapto compounds such as mercaptothiazoles, mercaptobenzothiazoles, mercaptobenzimidazoles, mercaptothiadiazoles, and mercaptopyrimidines; the above heterocyclic mercapto compounds having water-soluble groups such as carboxyl group and sulfon group; thioketo compounds such as oxazolinthion; azaindenes such as tetrazeindenes (especially, 4-hydroxy substituted (1,3,3a,7)-tetrazaindenes); benzenethiosulfonic acids; and benzenesulfinic acids.

In the light sensitive materials of the present invention, there may be used other various compounds such as antistatic agents, ultraviolet absorbers, plasticizers, developing agents, antihalation dyes, fluorescent dyes, development accelerators and couplers.

As supports of the light sensitive materials of the present invention, there may be used all of those which are ordinarily used as supports for photographic light sensitive materials such as, for example, cellulose nitrate film, cellulose acetate film, cellulose acetate butyrate film, cellulose acetate propionate film, polystyrene film, polyethylene terephthalate film, polycarbonate film and laminates thereof and papers. Further suitable supports are baryta paper, papers coated or laminated with $\alpha$-olefin polymers, especially polymers of $\alpha$-olefins of 2–10 carbon atoms such as polypropylene and plastic films the surface of which is roughened to improve close contact with other high molecular substances and increase printability as disclosed in Japanese Patent Examined Publication (Kokoku) No. 19068/72.

The hydrophilic colloid layers may be coated by the methods, such as, for example, air doctor coating, blade coating, squeeze coating, air knife coating, reverse roll coating, cast coating and extrusion coating. Coating amount is preferably 1–15 $\mu$m, more preferably 2–10 $\mu$m.

The light sensitive materials of the present invention are suitable for monochrome photographic light sensitive materials applied with semiconductor laser exposure.

Another object of this invention has been attained by a light sensitive lithographic printing plate material which comprises a support and, provided thereon, a silver halide emulsion layer containing a sensitizing dye having a spectral sensitivity maximum in a wavelength region longer than 700 nm and a physical development nuclei layer, characterized in that the emulsion layer contains the water-soluble polymer containing a carboxyl group and a number-average molecular weight of 20,000 or less which has been explained in detail hereinabove with reference to application to silver halide photographic light sensitive material and this water-soluble polymer can be applied here in the same manner as in preparation of the silver halide photographic light sensitive material explained hereabove.

Under the silver halide emulsion layer, (on the support), there may be provided a subbing layer to improve the adhesion and an undercoat layer which may contain colorants such as carbon black or compounds absorbing a light of longer than 700 nm. This layer may contain a developing agent or a matting agent.

The image receiving layer is provided over the silver halide emulsion layer, namely, as an outermost surface layer.

The physical development nuclei include known ones, for example, metals such as antimony, bismuth, cadmium, cobalt, palladium, nickel, silver, lead and zinc and sulfides thereof. The image receiving layer may contain at least one hydrophilic gelatin such as, for example, gelatin, carboxymethyl cellulose, gum arabic, sodium alginate, hydroxyethyl starch, dialdehyde starch, dextrin, hydroxyethyl cellulose, polystyrenesulfonic acid, vinylimidazole-acrylamide copolymer and polyvinyl alcohol. The amount of the hydrophilic gelatin contained in the image receiving layer is preferably 0.5 g/m² or less. The image receiving layer may further contain hydrogroscopic substances or wetting agents such as sorbitol and glycerol. It may contain also anti-scumming agents such as barium sulfate, titanium dioxide, China clay and silver, developing agents such as hydroquinone and hardeners such as formaldehyde and dichloro-S-triazine.

The supports used for the lithographic printing plate materials can be paper; films such as cellulose acetate film, polyvinyl acetal film, polystyrene film, polypropylene film and polyethylene terephthalate film; composite films such as polyester, polypropylene or polystyrene film coated with polyethylene film; metals; metallized papers; or metal/paper laminates. A paper support coated on one or both sides with an α-olefin polymer such as polyethylene is also useful. These supports may contain anti-halation compounds.

The developer used for making lithographic printing plate in this invention may contain alkaline substances such as, for example, sodium hydroxide, potassium hydroxide, lithium hydroxide and trisodium phosphate; preservatives such as sulfites; silver halide solvents such as thiosulfates, thiocyanates, cyclic imides, thiosalicylic acid and amines; thickeners such as hydroxyethyl cellulose and carboxymethyl cellulose; antifoggants such as potassium bromide, 1-phenyl-5-mercaptotetrazole and compounds described in Japanese Patent Kokai No. 47-26201; developing agents such as hydroquinone and 1-phenyl-3-pyrazolidone; and development modifiers such as polyoxyalkylene compounds and onium compounds.

In the silver complex diffusion transfer process, the developer may be contained in silver halide emulsion layer and/or image receiving layer or other water permeable layers contiguous thereto of light sensitive materials as disclosed in British Patent Nos. 1,000115, 1,012,476, 1,017,273 and 1,042,477. Therefore, in developing such materials, use may be made of a so-called "alkaline activating solution" containing no developing agent.

The lithographic printing plate made according to this invention is rendered ink receptive or is enhanced in ink receptivity by use of such compounds as described in Japanese Patent Kokoku No. 48-29723 and U.S. Pat. No. 3,721,539.

Printing method, etch solution and damping solution may be similar to those generally known to the art.

The following nonlimiting examples will further explain this invention.

EXAMPLE 1

A silver chlorobromide emulsion (silver bromide 10 mol %) having an average grain size of about 0.23 μm was prepared by the customary controlled double jet method. This was subjected to precipitation, washing with water and redissolution and then adjusted to gelatin/silver to 0.6/1.0 and sensitized with sulfur+gold. Thereafter, the above exemplified sensitizing dye (10) was added thereto in an amount of $1 \times 10^{-4}$ mol for 1 mol of silver halide, followed by further addition of an antifoggant, a hardener and a surface active agent. This emulsion was equally divided into 10 portions, to which were added polymers shown in Table 1 in an amount of 20 g for 1 mol of silver halide to obtain finished emulsions.

Each of these emulsions was coated on a polyester film at a coverage of 6 g/m² in terms of silver together with a protective layer (gelatin 1 g/m²) to obtain samples. A part of the samples were stored under the conditions of 50° C. and RH 80% for 5 days.

These samples were subjected to sensitometric exposure through a interference filter of 780 nm for $10^{-5}$ second and developed with PG developer, then fixed, washed with water and dried. Then, characteristics thereof were obtained.

The results are shown in Table 1. The sensitivity is a relative value when sensitivity of sample 1 just after preparation was assumed to be 100.

TABLE 1

| Sample | Polymer | Just after preparation | | After stored | |
|---|---|---|---|---|---|
| | | Sensitivity | Fog | Sensitivity | Fog |
| 1 | No | 100 | 0.03 | 60 | 0.05 |
| 2 | (1) | 150 | 0.03 | 140 | 0.05 |
| 3 | (11) | 150 | 0.03 | 140 | 0.05 |
| 4 | (14) | 130 | 0.03 | 120 | 0.05 |
| 5 | (26) | 150 | 0.03 | 140 | 0.05 |
| 6 | (28) | 150 | 0.03 | 140 | 0.05 |
| 7 | PA | 100 | 0.03 | 70 | 0.05 |
| 8 | SMA | 100 | 0.03 | 60 | 0.05 |
| 9 | SCS | 100 | 0.03 | 60 | 0.05 |
| 10 | CMC | 100 | 0.03 | 60 | 0.05 |

Notes:
PA: Polyacrylic acid of $\overline{Mn}$ $4 \times 10^4$
SMA: Styrene-maleic anhydride copolymer of $\overline{Mn}$ $7 \times 10^4$
SCS: KELCO-SCS (produced by Kelco Corporation of Japanese Patent Kokai No. 55-100554).
CMC: Carboxymethyl cellulose of $\overline{Mn}$ $10 \times 10^4$

EXAMPLE 2

A sample was prepared in the same manner as in Example 1 except that the exemplified sensitizing dye (28) in an amount of $2 \times 10^{-4}$ mol per 1 mol of silver halide was added to a silver iodobromide emulsion (average grain size of 0.21 μm) containing 2 mol % of silver iodide.

Samples were prepared in the same manner as above with addition of polymers shown in Table 2 in an amount of 40 g per 1 mol of silver halide. These samples were tested as above. The results are shown in Table 2.

TABLE 2

| Sample | Polymer | Just after preparation | | After stored | |
|---|---|---|---|---|---|
| | | Sensitivity | Fog | Sensitivity | Fog |
| 11 | No | 100 | 0.03 | 50 | 0.04 |
| 12 | (7) | 120 | 0.03 | 110 | 0.04 |
| 13 | (10) | 120 | 0.03 | 110 | 0.04 |

TABLE 2-continued

| | | Just after preparation | | After stored | |
|---|---|---|---|---|---|
| Sample | Polymer | Sensitivity | Fog | Sensitivity | Fog |
| 14 | (16) | 110 | 0.03 | 100 | 0.04 |
| 15 | (23) | 110 | 0.03 | 100 | 0.04 |
| 16 | (27) | 120 | 0.03 | 115 | 0.04 |
| 17 | PA | 100 | 0.03 | 55 | 0.04 |
| 18 | SMA | 100 | 0.03 | 50 | 0.04 |
| 19 | SCS | 100 | 0.03 | 50 | 0.04 |
| 20 | CMC | 100 | 0.03 | 50 | 0.04 |

EXAMPLE 3

A matting layer containing silica particles of 5 μ in average particle size was provided on one side of a subbed polyester film. On another side were provided an undercoat layer (adjusted to pH 4.5) containing carbon black and 20% by weight based on the photographic gelatin of silica powders, 7 μm in average particle size and a silver halide emulsion layer (adjusted to pH 4.5) chemically sensitized with a gold compound and hypo.

The above silver halide emulsion contained $5 \times 10^{-6}$ mol of rhodium chloride for 1 mol of silver halide, which had been added during physical ripening of the emulsion. The silver halide grains, in substantially cubic form, were 0.4 μ in average grain size and 90% or more of the total grains were distributed within ±30% of the average grain size.

The application rate of gelatin in the undercoat layer was 3.0 g/m², that of gelatin in the emulsion layer was 1.0 g/m² and that of silver halide was 1.2 g/m² in terms of silver nitrate. Both the undercoat layer and the emulsion layer contained 5.0 mg of formaldehyde as a hardener for 1 g of gelatin. After drying, the coated support was warmed at 40° C. for 14 days. The emulsion layer was then coated with a nuclei coating composition prepared in the same manner as in production of Plate No. 11 in Example 1 of Japanese Patent Kokai No. 54-103104.

A sample which contained in the silver halide emulsion layer the above exemplified sensitizing dye (25) in an amount of $1 \times 10^{-4}$ mol for 1 mol of silver halide. This was blank sample A.

Samples B-H were prepared by adding to the silver halide emulsion of the blank sample A the polymers as shown in Table 3. Addition amount of these polymers was 10 g for 1 mol of silver halide.

These samples just after preparation (left to stand at 35° C. for 24 hours) and after stored at 50° C. and 80% RH for 4 days were subjected to exposure in the following manner.

The samples were subjected to flash exposure of $10^{-5}$ second to the light, through an optical wedge, from a light source attached with a dark red filter (SC-70 of Fuji Photo Film Co., Ltd.) which transmitted a light longer than about 700 nm. These were samples for sensitometry.

Other samples were imagewise exposed by a laser diode scanner ULTRE SETTER (Ultre Co.) which emitted light at 780 nm. These were samples for printing test.

Thus imagewise exposed samples were developed with the following DTR developer at 25° C. for 30 seconds.

After the development, the sample was passed through a pair of squeeze rolls to remove the excess developer and immediately treated with the following neutralizing solution at 25° C. for 20 seconds and was again passed through the squeeze rolls to remove the excess liquid and dried at room temperature.

| DTR developer | |
|---|---|
| Water | 700 ml |
| Sodium hydroxide | 18 g |
| Potassium hydroxide | 7 g |
| Anhydrous sodium sulfite | 50 g |
| 2-Mercaptobenzoic acid | 2 g |
| Uracil | 2 g |
| 2-Methylamino ethanol | 30 ml |
| 5-Phenyl-2-mercapto-1,3,4-oxadiazole | 0.1 g |
| Made up with water to 1 liter. | |

| Neutralizing solution | |
|---|---|
| Water | 600 ml |
| Citric acid | 10 g |
| Sodium citrate | 35 g |
| Colloidal silica (20% solution) | 5 ml |
| Ethylene glycol | 5 ml |
| Made up with water to 1 liter. | |

Printing endurance was evaluated as follows: Each sample was pasted to one sheet, this sheet was mounted on an offset printing machine and the following etch solution was applied to the whole surface of the printing plate. Printing was carried out using the following damping solution. The printing plate employed was A. B. Dick 350CD (tradename for the offset printing machine of A. B. Dick Co.). Printing endurance in terms of the number of copies delivered before the printing had become impossible was evaluated by the following criteria. The results are shown in Table 3.

| Grade No. | Number of printed copies |
|---|---|
| 1 | <1,000 |
| 2 | 1,000–3,000 |
| 3 | 3,000–5,000 |
| 4 | 5,000–7,000 |
| 5 | >7,000 |

| Etch solution | |
|---|---|
| Water | 600 ml |
| Isopropyl alcohol | 400 ml |
| Ethylene glycol | 50 g |
| 3-Mercapto-4-acetamide-5-n-heptyl-1,2,4-triazole | 1 g |

| Damping solution | |
|---|---|
| Orthophosphoric acid | 10 g |
| Nickel nitrate | 5 g |
| Sodium sulfite | 5 g |
| Ethylene glycol | 100 g |
| Colloidal silica (20% solution) | 28 g |
| Made up with water to 2 liters. | |

The sensitivity was evaluated by photographic exposure required before the precipitation of the transferred silver had no more been observed and expressed as a relative value by assuming the sensitivity of sample A just after preparation to be 100.

TABLE 3

| Sample | Polymer | Just after preparation | | After stored | |
|---|---|---|---|---|---|
| | | Sensitivity | Printing endurance | Sensitivity | Printing endurance |
| A | No | 100 | 5 | 40 | 3 |
| B | (1) | 140 | 5 | 120 | 5 |
| C | (11) | 130 | 5 | 115 | 5 |
| D | (28) | 140 | 5 | 120 | 5 |
| E | PA | 100 | 5 | 50 | 3 |
| F | SMA | 100 | 5 | 50 | 3 |
| G | SCS | 100 | 5 | 40 | 3 |
| H | CMC | 100 | 5 | 50 | 3 |

Notes:
PA, SMA, SCS and CMC have the same meanings as in Table 1.

EXAMPLE 4

A sample of lithographic printing plate was prepared in the same manner as in Example 3 except that the exemplified sensitizing dye (17) in an amount of $2 \times 10^{-4}$ mol for 1 mol of silver halide was added to a silver chloroiodide emulsion containing 20 mol % of silver bromide and 1 mol% of silver iodide.

Samples of lithographic printing plates were prepared in the same manner as above with addition of the polymers shown in Table 4 in an amount of 20 g for 1 mol of silver halide to the emulsion.

The samples were tested in the same manner as in Example 3 except that the following DTR developer was used.

| DTR developer | |
|---|---|
| Water | 700 ml |
| Sodium hydroxide | 30 g |
| Anhydrous sodium sulfite | 60 g |
| Sodium thiosulfate (5 hydrate) | 15 g |
| Potassium thiocyanate | 10 g |
| Hydroquinone | 15 g |
| Phenidone | 2 g |
| Potassium bromide | 1 g |
| 1-Phenyl-5-mercaptotetrazole | 0.1 g |
| Made up with water to 1 liter | |

The results are shown in Table 4. The sensitivity was expressed as a relative value by assuming the sensitivity of sample I just after preparation to be 100.

TABLE 4

| Sample | Polymer | Just after preparation | | After stored | |
|---|---|---|---|---|---|
| | | Sensitivity | Printing endurance | Sensitivity | Printing endurance |
| I | No | 100 | 5 | 5 | 4 |
| J | (6) | 150 | 5 | 130 | 5 |
| K | (10) | 140 | 5 | 130 | 5 |
| L | (17) | 140 | 5 | 120 | 5 |
| M | (26) | 150 | 5 | 130 | 5 |

What is claimed is:

1. A silver halide photographic light sensitive material which comprises a support and a silver halide emulsion layer containing a sensitizing dye having a spectral sensitivity maximum in a wavelength region longer than 700 nm wherein said emulsion layer contains a water-soluble polymer which is a homopolymer of an olefinic unsaturated compound containing a carboxyl group, or a salt or an acid anhydride thereof, as a monomer unit or a copolymer of an olefinic unsaturated compound containing a carboxyl group, or a salt or an acid anhydride thereof, as a monomer unit with a vinyl monomer copolymerizable therewith, and the water-soluble polymer has a number-average molecular weight of 20,000 or less.

2. A light sensitive material according to claim 1 wherein content of the olefinic unsaturated compound containing a carboxyl group in the copolymer is at least about 10% by weight.

3. A light sensitive material according to claim 1 wherein the water-soluble polymer has a number-average molecular weight of 1,000–10,000.

4. A light sensitive material according to claim 1 wherein the sensitizing dye is at least one dye represented by the following formulas (I)–(IV):

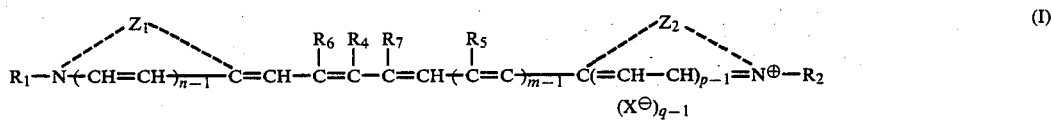
(I)

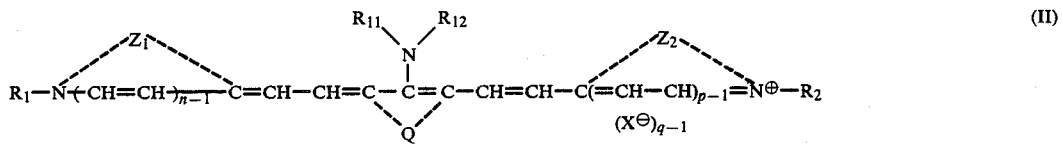
(II)

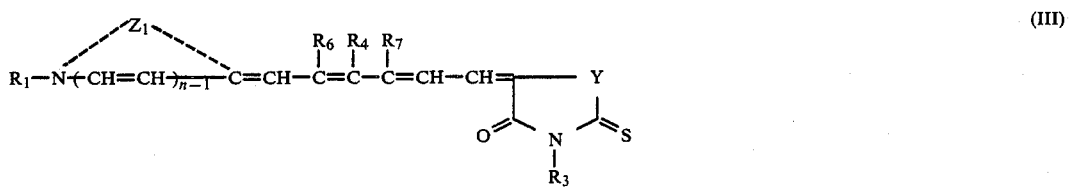
(III)

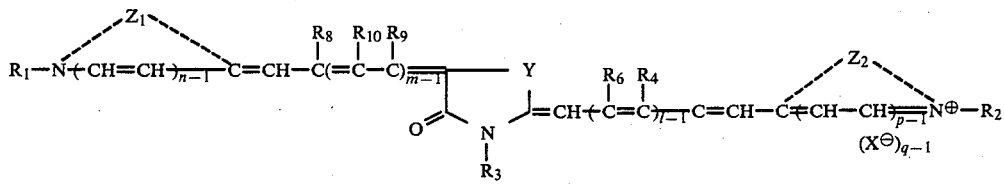

wherein $Z_1$ and $Z_2$ which may be identical or different each represents group of atoms necessary to form 5-membered or 6-membered nitrogen-containing heterocyclic ring; $R_1$ and $R_2$ which may be identical or different each represents an alkyl group or an alkenyl group; $R_3$ represents an alkyl group, an alkenyl group or an aryl group; $R_4$–$R_{10}$ which may be identical or different each represents a hydrogen atom, a halogen atom, an alkyl group, an aryl group or an alkoxy group and $R_6$ and $R_7$ or $R_8$ and $R_9$ may link to each other to form a 5-membered or 6-membered ring; $R_{11}$ and $R_{12}$ which may be identical or different each represents an alkyl group or an aryl group and may link to each other to form a 5-membered or 6-membered ring; Y represents a sulfur atom, an oxygen atom, $>$N-$R_{13}$ ($R_{13}$ is an alkyl group), X represents an acid anion; l, m, n, p and q each represents 1 or 2; and Q represents a group of atoms necessary to form 5-membered or 6-membered ring.

5. A light sensitive material according to claim 1 wherein amount of the sensitizing dye is $1 \times 10^{-6}$–$1 \times 10^{-3}$ mol for 1 mol of silver halide.

6. A method for image formation which comprises imagewise exposing the light sensitive material according to claim 1 with a semiconductor laser beam and developing it.

7. A light sensitive lithographic printing plate material which comprises a support and, provided thereon, a silver halide emulsion layer containing a sensitizing dye having a spectral sensitivity maximum in a wavelength region longer than 700 nm and a physical development nuclei layer which is an outermost surface layer wherein such emulsion layer contains a water-soluble polymer which is a homopolymer of an olefinic unsaturated compound containing a carboxyl group, or a salt or an acid anhydride thereof, as a monomer unit or a copolymer of an olefinic unsaturated compound containing a carboxyl group, or a salt or an acid anhydride thereof, as a monomer unit with a vinyl monomer copolymerizable therewith, and the water-soluble polymer has a number-average molecular weight of 20,000 or less.

8. A light sensitive lithographic printing plate material according to claim 7 which substantially have at least one of subbing layer and an undercoat layer under the emulsion layer.

9. A method of plate making which comprises imagewise exposing the light sensitive material according to claim 7 with a semiconductor laser beam and developing it with a developer containing a silver halide complexing agent to produce a silver image on the surface nuclei layer.

10. A method of printing which comprises mounting the printing plate made by the method according to claim 9, applying a printing ink on the silver image produced on the surface nuclei layer and carrying out printing.

* * * * *